(12) United States Patent
Pai et al.

(10) Patent No.: US 7,823,110 B2
(45) Date of Patent: Oct. 26, 2010

(54) METHOD AND SYSTEM FOR PROCESSING GEOMETRICAL LAYOUT DESIGN DATA

(75) Inventors: Ravi R. Pai, Karnataka (IN); Mark Pereira, Karnataka (IN); Nitin P Bhat, Karnataka (IN)

(73) Assignee: SoftJin Technologies Private Limited, Bangalore, Karnataka (IN)

( * ) Notice: Subject to any disclaimer, the term of this patent is extended or adjusted under 35 U.S.C. 154(b) by 0 days.

(21) Appl. No.: 11/912,153

(22) PCT Filed: Sep. 13, 2007

(86) PCT No.: PCT/IN2007/000412

§ 371 (c)(1),
(2), (4) Date: Oct. 22, 2007

(87) PCT Pub. No.: WO2008/032340

PCT Pub. Date: Mar. 20, 2008

(65) Prior Publication Data

US 2009/0293034 A1     Nov. 26, 2009

(30) Foreign Application Priority Data

Sep. 15, 2006    (IN) .................. 1703/CHE/2006

(51) Int. Cl.
*G06F 17/50* (2006.01)
(52) U.S. Cl. .......................................................... 716/7
(58) Field of Classification Search ...................... 716/7
See application file for complete search history.

(56) References Cited

U.S. PATENT DOCUMENTS

| | | | | |
|---|---|---|---|---|
| 5,699,265 A * | 12/1997 | Scepanovic et al. | ........... | 716/10 |
| 5,909,376 A * | 6/1999 | Scepanovic et al. | ............ | 716/8 |
| 6,134,702 A * | 10/2000 | Scepanovic et al. | ........... | 716/10 |
| 6,449,761 B1 * | 9/2002 | Greidinger et al. | ............ | 716/11 |
| 6,470,482 B1 * | 10/2002 | Rostoker et al. | ................ | 716/6 |
| 6,480,991 B1 * | 11/2002 | Cho et al. | ....................... | 716/8 |
| 6,519,749 B1 * | 2/2003 | Chao et al. | ..................... | 716/9 |

(Continued)

OTHER PUBLICATIONS

Banos et al., "A Parallel Evolutionary Algoirthm for Circuit Partitioning", Eleventh Euromicro Conference on Prallel, Distributed and Network-Based Processing, Feb. 5-7, 2003, pp. 365-371.*

*Primary Examiner*—Phallaka Kik
(74) *Attorney, Agent, or Firm*—Prakash Nama; Global IP Services, PLLC

(57) ABSTRACT

A method and system for processing geometrical layout design data in a computation network. The method includes assigning one or more partitions of the geometrical layout design data to one or more computing devices. One or more partitions are assigned based on first predefined parameters. The method further includes receiving a minimum-hierarchy representation of the geometrical layout design data and a partition information corresponding to one or more partition assigned. The partition information corresponding to a partition assigned includes a spatial information corresponding to the partition. Further, the minimum-hierarchy representation includes a plurality of cells. Each cell in the minimum-hierarchy representation may include zero or more bounding box information and zero or more cell-references. Further, the method includes retrieving one or more fragments based on each of the partition information and the minimum-hierarchy representation. A fragment can include one or more parts of a cell of the geometrical layout design data.

22 Claims, 4 Drawing Sheets

U.S. PATENT DOCUMENTS

| | | | |
|---|---|---|---|
| 7,614,033 B2 * | 11/2009 | Pierrat et al. | 716/21 |
| 2002/0078285 A1 * | 6/2002 | Hofstee et al. | 710/260 |
| 2002/0078308 A1 * | 6/2002 | Altman et al. | 711/147 |
| 2003/0005398 A1 * | 1/2003 | Cho et al. | 716/8 |

* cited by examiner

METHOD AND SYSTEM FOR PROCESSING GEOMETRICAL LAYOUT DESIGN DATA

FIELD OF INVENTION

The invention relates generally to designing of electronic circuits. More specifically, the invention relates to a method and system for processing geometrical layout design data.

BACKGROUND OF THE INVENTION

The process of designing an electronic circuit can be broadly divided into two stages, a pre-layout design stage and a post-layout design stage. Examples of the design process of an electronic circuit may include, but are not limited to designing of Integrated Circuits (IC), Printed circuit Boards (PCB), Micro Electro Mechanical Systems (MEMS), and Multi Chip Modules (MCM).

The pre-layout design stage includes transforming a circuit design into a physical layout data. The physical layout data includes details of the physical locations of the circuit elements. Further, in the post-layout design stage, the physical layout data is converted into geometrical layout design data. The geometrical layout design data is used for manufacturing the electronic circuit.

The post-layout design stage includes processing of large geometrical layout design data. Processing of such data may take a significant computation overhead. Some existing methods use parallel processing of the geometrical layout design data to ensure efficient and accurate processing of the geometrical layout design data, for example, using a network of computing devices. In some methods, in a computation network, a server partitions the geometrical layout design data and transmits one or more partitions to one or more computing devices in the computation network. However, such computation networks have high startup time because processing of the geometrical layout design data starts only after the server partitions the geometrical layout design data. This results in an inefficient utilization of processing resources of computing devices. Additionally, as partitions are transmitted to computing devices at the same time, therefore, this may result in clogging of the computation network and increase the load on the server.

In some existing techniques for processing geometrical layout design data server sends the complete geometrical layout design data to each computing device. Thereafter, each computing device extracts the corresponding partition from the geometrical layout design data. However, this results in clogging of the network, as the geometrical layout design data, which is very huge in size, is transmitted to each computing device. Moreover, as the geometrical layout design data is copied on each computing device in the computation network, therefore, this leads to duplication of geometrical layout design data.

There is therefore, a need for a method and system for processing the geometrical layout design data by distributing load in an efficient manner. Further, there is a need for a method and system that has a low startup time and processes geometrical layout design data without clogging the server and the network.

SUMMARY OF THE INVENTION

An object of the invention is to provide a method and system for processing geometrical layout design data efficiently.

Another object of the invention is to provide a method and system for processing geometrical layout design data by distributing load in an efficient manner.

Yet another object of the invention is to provide a method and system for processing geometrical layout design data without clogging the server and the computation network.

Another object of the invention is to provide a system for processing geometrical layout design data that has a low startup time.

The above listed objects are achieved by providing a method and system for processing geometrical layout design data. The method includes assigning one or more partitions of the geometrical layout design data to one or more computing devices. One or more partitions are assigned based on first predefined parameters. The method further includes receiving a minimum-hierarchy representation of the geometrical layout design data and a partition information corresponding to one or more partition assigned. The partition information corresponding to a partition assigned includes a spatial information corresponding to the partition. Further, the minimum-hierarchy representation includes a plurality of cells. Each cell in the minimum-hierarchy representation may include zero or more bounding box information and zero or more cell-references. Further, the method includes retrieving one or more fragments based on each of the partition information and the minimum-hierarchy representation. A fragment can include one or more parts of a cell of the geometrical layout design data.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the invention.

Figure 1:
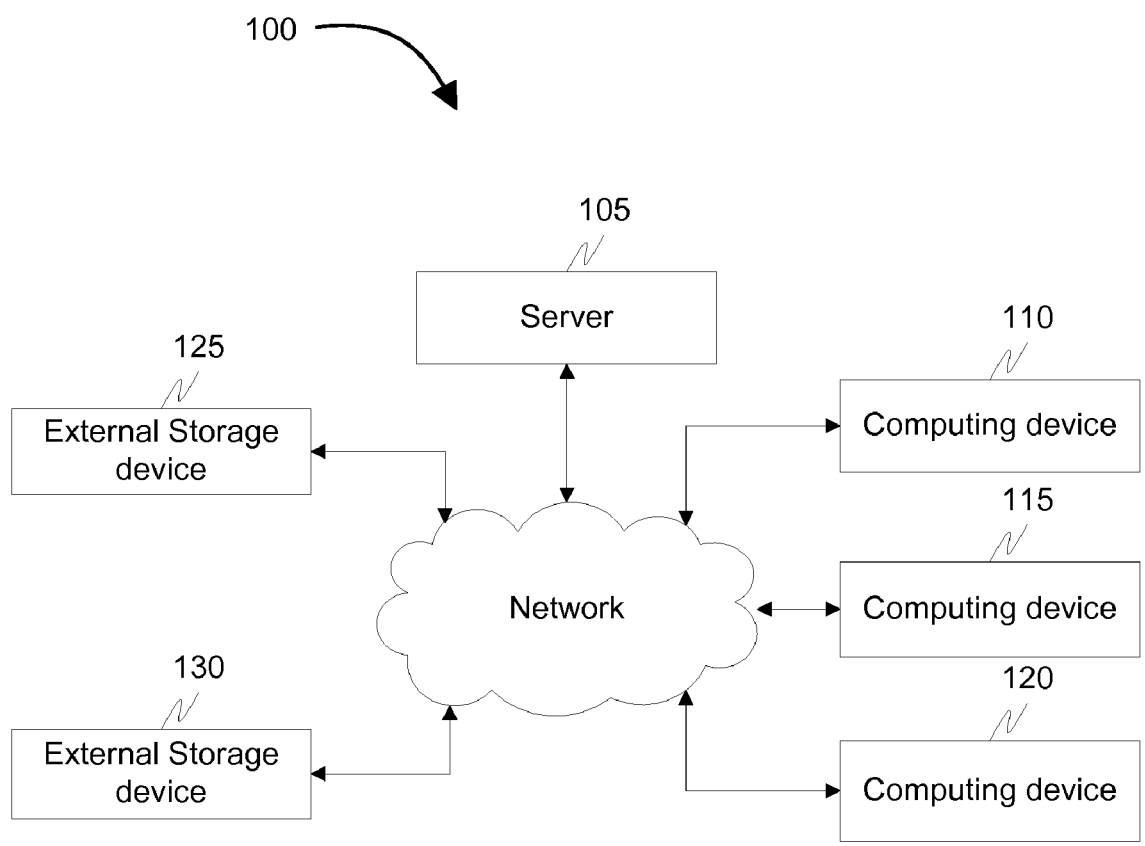
FIG. 1 is a block diagram showing a computation network for processing geometrical layout design data, in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Before describing in detail embodiments that are in accordance with the invention, it should be observed that the embodiments reside primarily in combinations of method steps and apparatus components related to method and system for processing geometrical layout design data. Accordingly, the apparatus components and method steps have been represented where appropriate by conventional symbols in the drawings, showing only those specific details that are pertinent to understanding the embodiments of the invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Various embodiments of the invention provide methods and systems for processing geometrical layout design data. The method includes assigning one or more partitions of the geometrical layout design data to one or more computing devices based on first predefined parameters. Thereafter, a partition information corresponding to one or more partition assigned and a minimum-hierarchy representation of the geometrical layout design data are received by one or more computing devices. A partition information corresponding to a partition assigned to a computing device includes a spatial information of the partition. The minimum-hierarchy representation includes a plurality of cells. Each cell in the minimum-hierarchy representation includes zero or more bounding box information and zero or more cell-references. Thereafter, one or more computing devices retrieve one or more fragments based on the minimum-hierarchy representation and the corresponding partition information. Thereafter, one or more partitions are processed by one or more computing devices using one or more fragments retrieved.

FIG. 1 is a block diagram showing a computation network 100 for processing geometrical layout design data, in accordance with an embodiment of the invention. Computation network 100 includes a server 105 and one or more computing devices (for example, a computing device 110, a computing device 115, and a computing device 120) operatively coupled with server 105. The geometrical layout data design includes a plurality of geometrical figures. Server 105 generates a minimum-hierarchy representation of the geometrical layout design data. The minimum-hierarchy representation includes a plurality of cells of the geometrical layout design data. Each cell in the minimum-hierarchy representation includes zero or more bounding box information and zero or more cell-references. The bounding box information includes information of a bounding box corresponding to an instance of a cell. A bounding box is the smallest rectangle that encloses each geometrical figure of a cell. Further, a cell-reference points to an instance of a cell. This is explained in further detail in conjunction with FIG. 3.

To process the geometrical layout design data, server 105 determines a plurality of partitions from the geometrical layout design data. Thereafter, server 105 assigns one or more partitions to one or more of computing device 110, computing device 115 and computing device 120 based on first predefined parameters. The first predefined parameters may include, but are not limited to, size of a partition, processing load of a computing device, processing power of a computing device, network parameters corresponding to computation network 100 and a processing history of a computing device, which may include a list of partitions processed by the computing device. This is explained in detail in conjunction with FIG. 3.

A partition may include one or more parts of one or more fragments in the geometrical layout design data. Server 105 divides the geometrical layout design data into a plurality of fragments based on second predefined parameters. Each fragment may include one or more parts of one or more cells of the geometrical layout design data. The second predefined parameters may include, but are not limited to, size of geometrical layout design data within a cell and processing power of a computing device. This is explained in detail in conjunction with FIG. 3. Server 105 stores the plurality of fragments on its memory, for instance, a hard disk. Alternatively, server 105 may store the plurality of fragments on one or more of external storage device 125 and external storage device 130, which are operatively coupled with server 105. It will be apparent to a person skilled in the art that there may be more than two external storage devices in computation network 100. External storage device 125 and external storage device 130 may constitute one of a Network File System (NFS).

After assigning one or more partitions of the geometrical layout design data, each of computing device 110, computing device 115, and computing device 120 receive the minimum-hierarchy representation and a partition information from server 105. A partition information includes a spatial information corresponding to a partition assigned to a computing device. The spatial information may be, for example, but not limited to geometrical coordinates, a position vector, a X/Y sorted edge representation, a Voronoi diagram, a Quad-tree and an Oct-tree. For example, if a partition is a rectangle, spatial information corresponding to the partition may include the geometrical coordinates of the endpoint of a diagonal of the rectangle.

Based on the corresponding partition information, each of computing device 110, computing device 115, and computing device 120 read geometrical layout design data corresponding to a partition assigned to a computing device from server 105. Thereafter, based on the minimum-hierarchy representation, each of computing device 110, computing device 115, and computing device 120 retrieves one or more fragments from server 105. A computing device may copy one or more fragments from server 105 to its memory, for example, a hard disk. Alternatively, a computing device may retrieve one or more parts of a fragment from one or more computing devices. For example, computing device 110 can retrieve a fragment from computing device 115 if the fragment is available at computing device 115. By way of another example, computing device 110 may retrieve the first half of a fragment from computing device 115 and the second half a fragment from computing device 120. To facilitate this, server 105 may maintain a processing database. The processing database includes one or more of, a list of partitions assigned to each computing device, processing load of each computing device, a list of fragments retrieved by each computing device, and network parameters of computation network 100. Therefore, a computing device may access the processing database in server 105 to determine one or more suitable computing devices to retrieve one or more fragments.

In an embodiment of the invention, a computing device may retrieve one or more fragments from one or more of external storage device 125 and external storage device 130, based on the minimum-hierarchy representation. In this case, a computing device may directly access one or more fragments from one or more of external storage device 125 and external storage device 130. For example, computing device 110 may directly read one or more fragments into its Random Access Memory (RAM) for processing. In another embodiment of the invention, a computing device copies one or more fragments corresponding to the partition assigned to the computing device from one or more of external storage device 125 and external storage device 130 to its hard disk. After copying each fragment, the computing device processes one or more fragments by copying each of the fragments to a RAM of the computing device.

After a computing device retrieves each fragment corresponding to a partition assigned to the computing device, the computing device processes the partition using fragments that are retrieved. The computing device may perform one or more of Boolean operations, Geometrical operations, and check operations. Examples of Boolean operations include, but are not limited to, union, and intersection. Examples of Geometrical operations include, but are not limited to, sizing, converting into trapezoids, converting into polygons. Examples of Rule check operations include, but are not limited to, spacing, width check, containment check.

Figure 2:
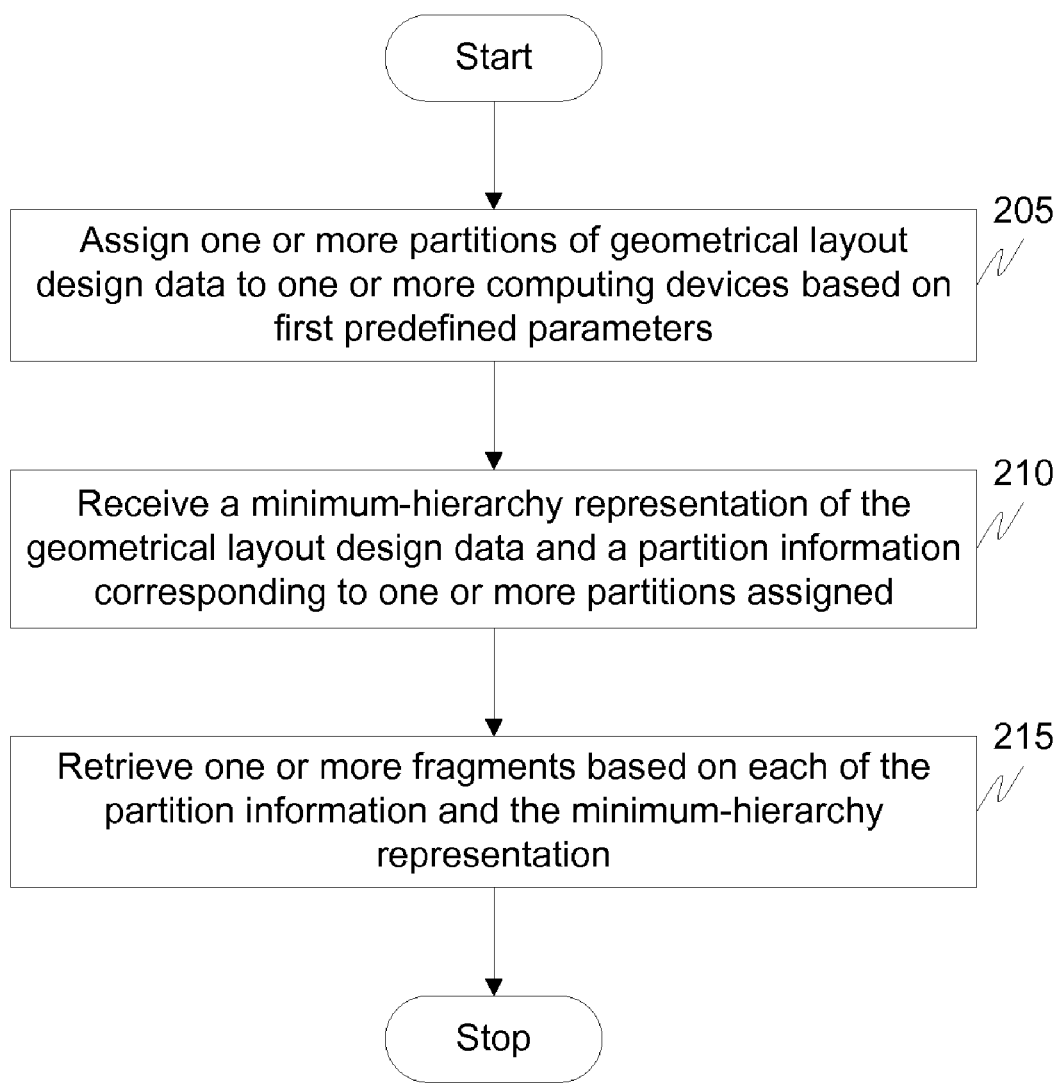
FIG. 2 is a flow diagram showing a method for processing geometrical layout design data, in accordance with an embodiment of the invention.

FIG. 2 is a flow diagram showing a method for processing geometrical layout design data, in accordance with an embodiment of the invention. To process the geometrical layout design data, server 105 generates a minimum-hierarchy representation of the geometrical layout design data. The minimum-hierarchy representation includes a plurality of cells. Each cell includes zero or more bounding box information and zero or more cell-references. The bounding box information includes information of a bounding box corresponding to an instance of a cell. A bounding box is the smallest rectangle that encloses each geometrical figure of a cell. Further, a cell-reference points to an instance of a cell. The cell-reference can be, for example, a pointer or a link to an instance of a cell.

Additionally, server 105 divides the geometrical layout design data into a plurality of fragments based on second predefined parameters. The second predefined parameters may include one or more of, but are not limited to, size of geometrical layout design data within a cell and processing power of a computing device. Thereafter, server 105 determines a plurality of partitions from the geometrical layout design data. This is further explained in conjunction with FIG. 3.

After determining the plurality of partitions from the geometrical layout design data, server 105 assigns one or more partitions to one or more computing devices based on first predefined parameters, at step 205. The first predefined parameters may include, but are not limited to, size of a partition, processing load of a computing device, processing power of a computing device, network parameters corresponding to computation network 100, and a processing history of a computing device, which include a list of partitions processed by the computing device.

Server 105 may assign partitions to a computing device based on processing load of the computing device. Processing load of a computing device may depend on one or more of, but is not limited to, number of operations performed by a computing device, amount of data transferred from a memory, for example, a RAM or a hard disk. Alternatively, server 105 may assign partitions to a computing device based on the processing power of the computing device. The processing power of a computing device may include the size of a RAM, the size of a hard disk, a processor speed, cache memory, and number of processor elements. By way of an example, server 105 may assign larger partitions to a computing device that has high processing power.

Further, server 105 may assign partitions based on the network parameters. The network parameters may be one or more of, but are not limited to, congestion in computation network 100, and bandwidth of computation network 100. Server 105 may assign smaller partition if the network parameters of computation network 100 are not favorable. As an example, consider a case when there is congestion in computation network 100, therefore, server 105 may assign partitions which are smaller in size to computing devices in computation network 100 so that escalation of congestion is minimized.

Additionally, server 105 may assign partitions based on the processing history of a computing device. For instance, partitions which are collocated in the geometrical layout design data may be assigned to the same computing device. This facilitates efficient processing of geometrical layout design data. As one or more instances of a cell may be common for collocated partitions, therefore, an instance of a cell in a collocated partition may already be present in the computing device. Therefore, while processing a collocated partition at a computed device, retrieval of some fragments may not be required since such fragments are already processed in at the computing device. This increases efficiency of computation network 100.

Server may assign partitions based on the size of the partitions. In an embodiment, the size of partitions assigned by server 105 may be based on the time of assigning of the partition. For example, server 105 may assign partitions in an increasing order of size. Alternatively, server 105 may assign partitions in a decreasing order of size. In an embodiment of the invention, server 105 assigns smaller partitions for a predetermined time period while initiating (startup) and terminating the processing of geometrical layout design data. Additionally, server 105 assigns relatively larger partitions in between the initiation and the termination of the processing. For example, server 105 assigns partitions which are less than a predefined threshold size in first quarter of the total time taken for processing the geometrical layout design data. Thereafter, in the second quarter and the third quarter of the total time, server 105 assigns partitions which are larger than the predefined threshold size. Thereafter, in the fourth quarter of the total time, server 105 again assigns the partitions which are less than the predefined threshold size. This increases the efficiency of processing geometrical layout design data, as during the initiation (startup) of the processing, transferring smaller partitions to computing devices decreases the startup time of the processing in computation network 100. Similarly, during termination of the processing, assigning smaller partitions ensures that each computing device in computation network 100 finish the processing at almost the same time, thereby avoiding a bottleneck in which one or more computing devices have to wait for a single computing device to finish processing.

After server 105 assigns one or more partitions, one or more computing devices in computation network 100 receive the minimum-hierarchy representation and a partition information, at step 210. The partition information corresponds to a partition assigned to a computing device by server 105. The partition information includes a spatial information of the partition. The spatial information may include, for example, but not limited to geometrical coordinates, a position vector, a X/Y sorted edge representation, a Voronoi diagram, a Quadtree, and an Oct-tree. The spatial information may be used by a computing device for locating a partition assigned to the computing device by server 105. For example, if a partition is a rectangle, spatial information corresponding to the partition may include the geometrical coordinates of the endpoint of a diagonal of the rectangle. Thereafter, one or more computing devices of computation network 100 read geometrical layout design data corresponding to one or more partitions assigned, from server 105. For example, each of computing device 110, computing device 115, and computing device 120 may read a geometrical layout design data corresponding to a partition assigned, from server 105.

After receiving the minimum-hierarchy representation and a partition information of a partition assigned, one or more computing devices retrieve one or more fragments at step 215. A fragment may include one or more parts of a cell of the geometrical layout design data. Alternatively, a fragment may include one or more cells of the geometrical layout design data. One or more computing devices retrieve one or more fragments based on each of the partition information and the minimum-hierarchy representation. A computing device performs a hierarchical window query on the minimum-hierarchy representation to determine one or more fragments which need to be retrieved based on the partition assigned to the computing device. Thereafter, the computing device retrieves a fragment from server 105 which stores the plurality of fragments. Alternatively, the computing device may retrieve a part of the fragment from server 105.

A computing device may retrieve one or more parts of a fragment from one or more computing devices. To facilitate this, server 105 may store a processing database. The processing database can store one or more of, but not limited to, a list of partitions assigned to each computing device, processing load of each computing device, a list of fragments retrieved by each computing device, and network parameters of the computation network. A computing device may access the processing database in server 105 to determine one or more suitable computing devices to retrieve one or more fragments. As an example, if computing device 110 needs a fragment A, which may be available at computing device 115 and computing device 120. Server 105 may instruct computing device 110 to retrieve a first part of the fragment A from computing device 115 and a second part of the fragment A from computing device 120. The instruction given by server 105 may be based on the processing load on each of computing device 115 and computing device 120. A fragment may reside at one or more computing devices at any point of time, therefore, one or more parts of a fragment may be retrieved from multiple computing devices. This ensures even distribution of load on server 105 and one or more computing devices.

In an embodiment of the invention, a computing device may retrieve one or more fragments from one or more of external storage device 125 and external storage device 130. Each of external storage device 125 and external storage device 130 may store the plurality of fragments of the geometrical layout design data. External storage device 125 and external storage device 130 may constitute a Network File System (NFS).

After each fragment corresponding to a partition assigned to a computing device is retrieved, the computing device processes the partition using one or more fragments retrieved. The computing device can perform one or more of Boolean operations, Geometrical operations, Rule check operations. Examples of Boolean operations include, but are not limited to, union, and intersection. Examples of Geometrical operations include, but are not limited to, sizing, converting into trapezoids, converting into polygons. Examples of Rule check operations include, but are not limited to, spacing, width check, containment check.

Figure 3:
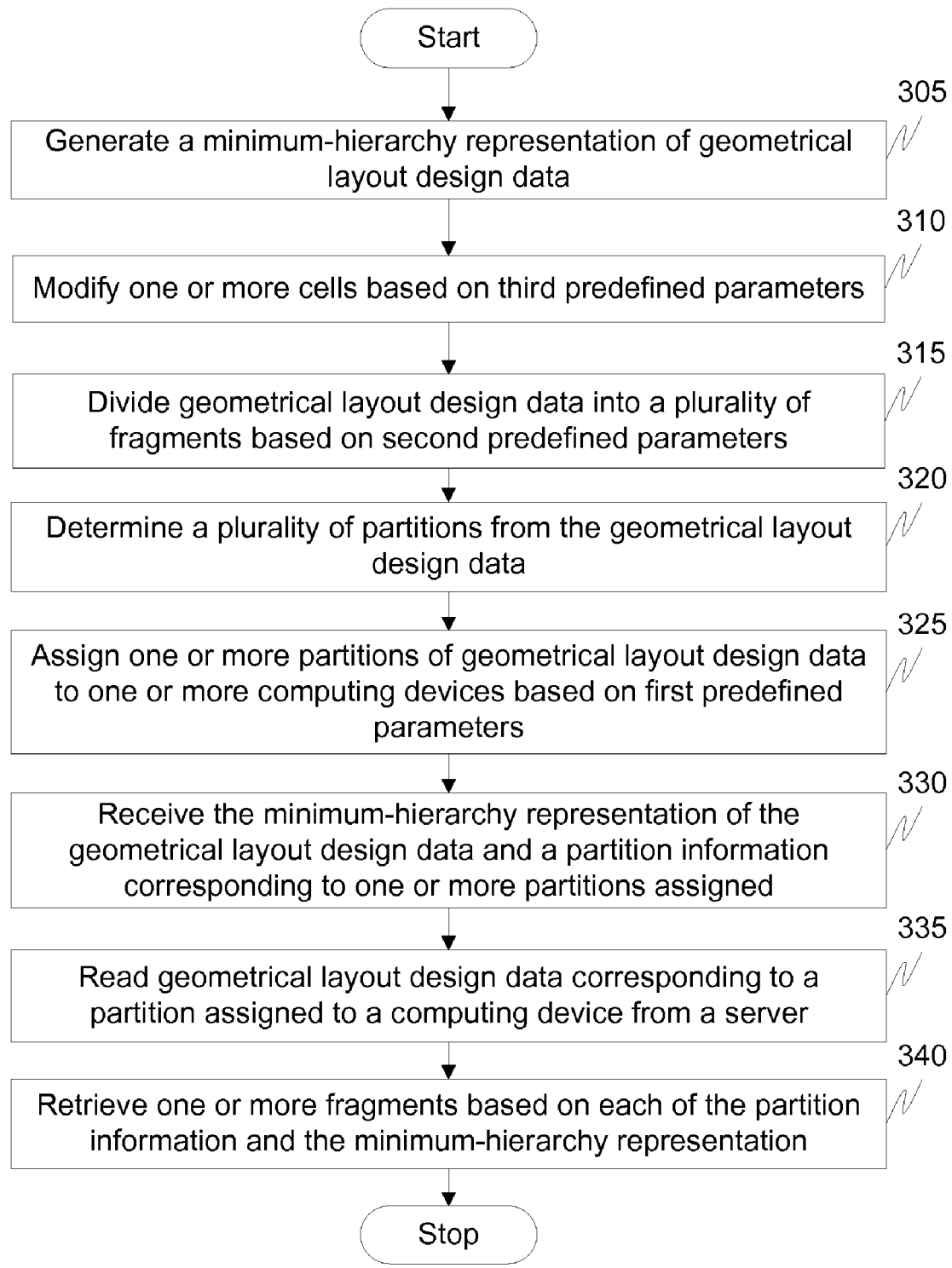
FIG. 3 is a flow diagram showing a method for processing geometrical layout design data, in accordance with another embodiment of the invention.

FIG. 3 is a flow diagram showing a method for processing geometrical layout design data, in accordance with another embodiment of the invention. To process the geometrical layout design data, server 105 generates a minimum-hierarchy representation of the geometrical layout design data, at step 305. The minimum-hierarchy representation includes a plurality of cells. Each cell includes zero or more bounding box information and zero or more cell-references. The bounding box information includes information of bounding box corresponding to an instance of a cell. A bounding box is the smallest rectangle that encloses all geometrical figures corresponding to the cell. The bounding box information can, for example, include coordinates of the end points of diagonal of the bounding box. Further, a cell-reference points to an instance of a cell. The cell-reference, for example, may be, a pointer or a link to an instance of a cell. Each leaf cell in the minimum-hierarchy representation includes only a bounding box information but no cell references. However, each non-leaf cell in minimum-hierarchy representation includes one or more cell-references. Additionally, a non-leaf cell may include a bounding box information.

The minimum-hierarchy representation may be generated in a predefined format, for example, but not limited to, Graphic Data System-II (GDSII™) and Open Artwork System Interchange Standard (OASIS™). The minimum-hierarchy representation may be compressed after generation. For example, minimum-hierarchy representation generated in a GDSII format may be compressed by server 105 using one or more of compaction techniques and compression techniques. It will be apparent to a person skilled in the art that compaction technique retains the original format. However, the compression technique changes the original format.

The minimum-hierarchy representation excludes the geometrical figures of the geometrical layout design data. Therefore, the minimum-hierarchy representation is smaller than a hierarchical representation, which may be Directed Acyclic Graph (DAG), of the geometrical layout design data. As a result, the minimum-hierarchy representation requires less bandwidth for transmission, thereby facilitating efficient distribution of data in computation network 100. Additionally, less time and less computation resources are required for generating the minimum-hierarchy representation from the hierarchal representation, as the hierarchal representation is already present in the geometrical layout design data, for formats like GDSII and OASIS. Therefore, time required for generation of minimum-hierarchy representation is negligible, therefore it does not affect the startup time adversely.

One or more cells of the geometrical layout design data may be modified by server 105 based on third predefined parameters, at step 310. The modification may include one or more of, dividing a cell in the geometrical layout design data into a plurality of cells and combining one or more cells to generate a composite cell. The third predefined parameters may include one or more of, but not limited to, size of geometrical layout design data in a cell and geometrical layout design data of a cell being placed in a plurality of design layers. For example, if size of geometrical layout design data in a cell is large, server 105 may divide the cell into a plurality of sub-cells. Similarly, if geometrical layout design data of a cell is placed in a plurality of design layers, server 105 may divide the cell in a plurality of sub-cells, with geometrical layout design data of each layer corresponding to the cell forming a sub-cell. Similarly, a plurality of cells may be merged to form a composite cell when size of geometrical layout design data in each cell in the plurality of cells is small.

After modifying one or more cells, server 105 divides the geometrical layout design data into a plurality of fragments based on second predefined parameters, at step 315. Referring back to FIG. 2, a fragment may include one or more parts of one or more cells of the geometrical layout design data. The second predefined parameters may include one or more of, but are not limited to, size of geometrical layout design data within a cell and processing power of a computing device. The processing power of a computing device may depend on one or more of the size of a RAM, the size of the hard disk, a processor speed, cache memory, and number of processing elements. Server 105 may divide the geometrical layout design data into the plurality of fragments based on the size of geometrical layout design data within a cell. For example, if the size of geometrical layout design data in a cell is large, server 105 may divide the cell into a plurality of fragments. Alternatively, server 105 can combine a plurality of cells to constitute a fragment. Further, server 105 may divide the geometrical layout design data based on the processing power of one or more of computing device 110, computing device 115, and computing device 120. For example, server 105 may determine that the size of the RAM of each computing device in computation network 100 is less than a predefined threshold. Therefore, server 105 may divide the geometrical layout design data into small fragments. The division of geometrical layout design data into the plurality of fragments enables efficient processing of geometrical layout design data in computation network 100. In an embodiment of the invention, the minimum-hierarchy representation is generated along with the plurality of fragments.

After dividing the geometrical layout design data into a plurality of fragments, server 105 determines a plurality of partitions from the geometrical layout design data, at step 320. Referring back to FIG. 2, a partition may include one or more parts of one or more fragments in the geometrical layout design data. To determine the plurality of partitions, server 105 may perform a window query operation on the geometrical layout design. In this case, a partition may correspond to a query window. Server 105 may determine the plurality of partition of geometrical layout design data, such that each partition is equal in size. Additionally, the number of partitions determined by server 105 exceeds the number of computing devices in computation network 100. This enables efficient utilization of processing resources of computing devices and avoids bottlenecks in processing the geometrical layout design data. For example, if number of partitions of the geometrical layout design data is equal to the number of computing devices, some of the computing devices, which have a higher processing power, may finish the processing of the corresponding partition faster than other computing devices, which have a lower processing power. As a result of this, at a given point of time, computing device having lower processing power will be processing the corresponding partitions and the computing device having high processing power will be idle. This results in wastage of processing power of the computing devices and creates a bottleneck in computation network 100 as the throughput of the system will be dictated by the slowest machine.

Thereafter, server 105 assigns one or more partitions to one or more of computing devices in computation network 100, at step 325. Server 105 assigns one or more partitions based on first predefined parameters. At step 330, one or more computing devices in computation network 100 receive the minimum-hierarchy representation and a partition information from server 105. The partition information corresponds to a partition assigned to a computing device by server 105. This has been explained in detail in conjunction with FIG. 2.

Based on the minimum-hierarchy representation and a corresponding partition information, at step 335, one or more computing devices of computation network 100 read geometrical layout design data corresponding to a partition assigned from server 105. For example, each of computing device 110, computing device 115, and computing device 120 may read geometrical layout design data corresponding to a partition assigned from server 105. A computing device may copy a corresponding partition from server 105 to its hard disk and thereafter read the partition. Alternatively, a computing device may directly read the partition, for example, in a RAM of the computing device, and thereafter read the partition. The geometrical layout design data corresponding to a partition read by a computing device is in a predefined format. The predefined format can be one or more of GDSII™, and OASIS™. The geometrical layout design data corresponding to a partition read from server 105 may be compressed by server 105 using one or more of compaction techniques and compression techniques. Server 105 may compact a geometrical layout design data in a partition, and thereafter, may compress the compacted geometrical layout design data. This helps in reducing the amount of data transfer in the network and increases the efficiency of computation network 100.

Thereafter, at step 340, one or more computing devices retrieve one or more fragments. One or more computing devices retrieve one or more fragments based on each of the partition information and the minimum-hierarchy representation. A computing device performs a hierarchical window query on the minimum-hierarchy representation to determine one or more fragments which need to be retrieved based on the partition assigned to the computing device. After determining one or more fragments which need to be retrieved, the computing device retrieves a fragment from server 105 which stores the plurality of fragments. After each fragment corresponding to a partition assigned to a computing device is retrieved, the computing device processes the partition using one or more fragments that are retrieved. A computing device can perform one or more of Boolean operations, Geometrical operations, Rule check operations. This is explained in detail in conjunction with FIG. 2.

Figure 4:
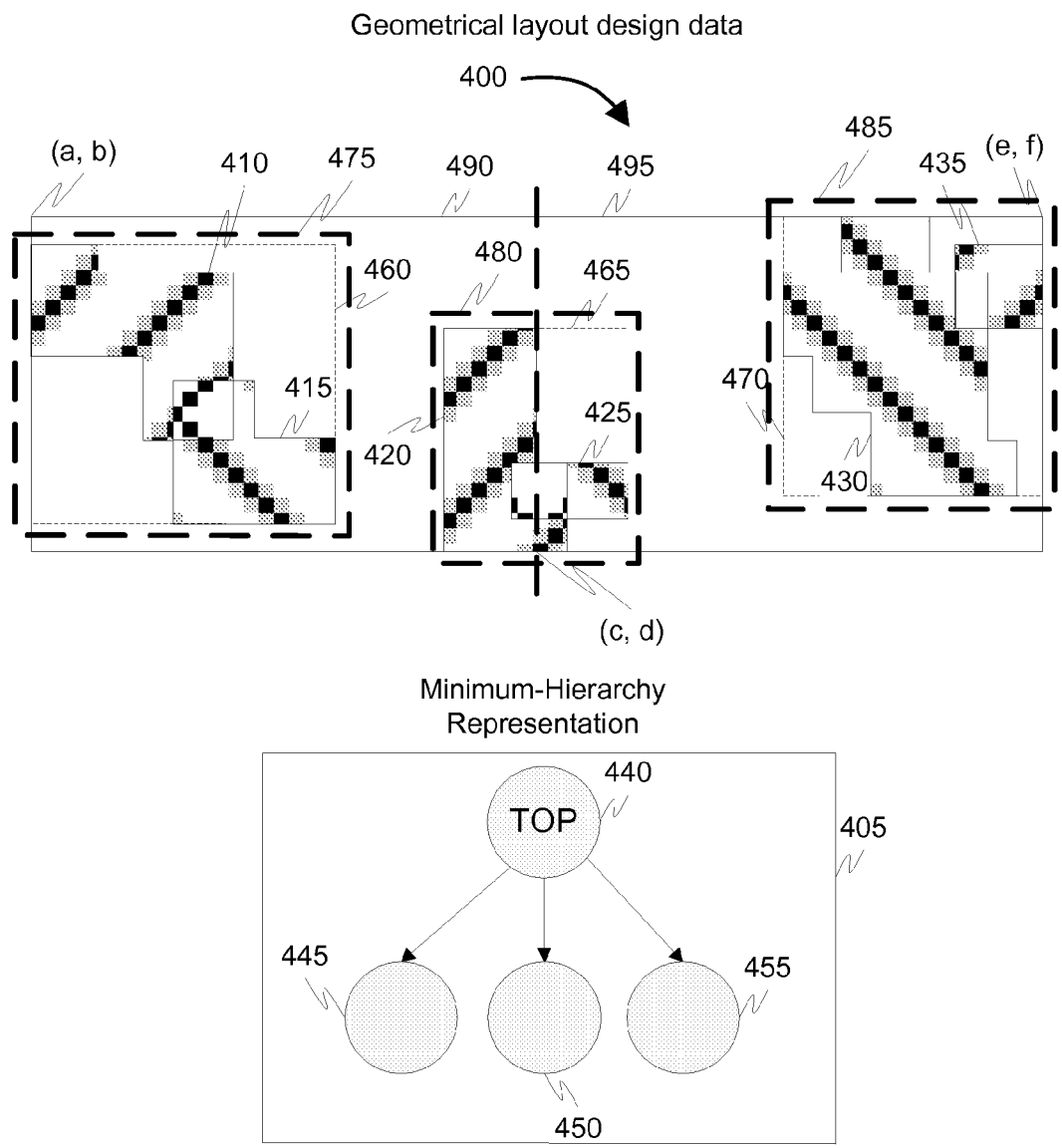
FIG. 4 is a block diagram showing processing of geometrical layout design data based on partition information and a minimum-hierarchy representation of the geometrical layout design data, in accordance with an embodiment of the invention.

FIG. 4 is a block diagram showing processing of a geometrical layout design data 400 based on partition information and a minimum-hierarchy representation 405 of geometrical layout design data 400, in accordance with an exemplary embodiment of the invention. Geometrical layout design data 400 may include a plurality of geometrical figures. The plurality of geometrical figures includes a geometrical FIG. 410, a geometrical FIG. 415, a geometrical FIG. 420, a geometrical FIG. 425, a geometrical FIG. 430, and a geometrical FIG. 435.

The plurality of geometrical figures is represented using minimum-hierarchy representation 405, which is generated by server 105. Minimum-hierarchy representation 405 includes a top cell 440, a cell 445, a cell 450, and a cell 455. Top cell 440 corresponds to geometrical layout design data 400 and includes references to cell 445, cell 450, and cell 455. Cell 445 corresponds to geometrical FIG. 410 and geometrical FIG. 415 and includes information of a bounding box 460. Bounding box 460 is the smallest rectangle enclosing each of geometrical FIG. 410 and geometrical FIG. 415. The information corresponding to bounding box 460 in cell 445 includes coordinates of the endpoints of a diagonal of bounding box 460. Further, bounding box 460 includes spatial information of each of geometrical FIG. 410 and geometrical FIG. 415.

Similarly, cell 450 corresponds to geometrical FIG. 420 and geometrical FIG. 425 and includes information of a bounding box 465. Bounding box 465 is the smallest rectangle enclosing each of geometrical FIG. 420 and geometrical FIG. 425. The information corresponding to bounding box 465 in cell 450 includes coordinates of the endpoints of a diagonal of bounding box 465. Further, bounding box 465 includes the spatial information of each of geometrical FIG. 420 and geometrical FIG. 425. Similarly, cell 455 corresponds to geometrical FIG. 430 and geometrical FIG. 435, and includes information of a bounding box 470. Bounding box 470 is the smallest rectangle enclosing each of geometrical FIG. 430 and geometrical FIG. 435. The information corresponding to bounding box 470 in cell 455 includes coordinates of the endpoints of a diagonal of bounding box 470. Further, bounding box 470 includes spatial information of each of geometrical FIG. 430 and geometrical FIG. 435.

Server 105 divides geometrical layout design data 400 into a fragment 475, a fragment 480, and a fragment 485. Fragment 475 include cell 445. Similarly, fragment 480 includes cell 450 and fragment 485 includes cell 455. Thereafter, server 105 determines a partition 490 and a partition 495, which are equal in size, based on second predefined parameters. Server 105 assigns partition 490 to computing device 110 and partition 495 to computing device 115 based on first predefined parameters. The first predefined parameters and second predefined parameters have been explained in conjunction with FIG. 3. Thereafter, server 105 sends a corresponding partition information and minimum-hierarchy representation 405 to each of computing device 110 and computing device 115. Computing device 110 receives a partition information corresponding to partition 490 and computing device 115 receives a partition information corresponding to partition 495. Partition information corresponding to partition 490 includes the coordinates of partition 490, i.e., (a, b) and (c, d). Similarly, partition information corresponding to partition 495 includes the coordinates of partition 495, i.e., coordinates (c, d) and (e, f).

Thereafter, computing device 110 reads partition 490 from server 105 and computing device 115 reads partition 495 from server 105. Each of computing device 110 and computing device 115 perform a hierarchical window query on minimum-hierarchy representation 405 to determine one or more fragments that need to be retrieved from server 105. Computing device 110 determines that it needs to retrieve fragment 475 and fragment 480 to processes partition 490. For this, computing device 110 retrieves cell 445 from fragment 475 and cell 450 from fragment 480. Thereafter, computing device 110 retrieves bounding box 460 from cell 445 and bounding box 465 from cell 450. Similarly, computing device 115 determines that it needs to retrieve fragment 480 and fragment 485 to process partition 495. For this, computing device 115 retrieves cell 450 from fragment 480 and cell 455 from fragment 485. Thereafter, computing device 115 retrieves bounding box 465 from cell 450 and bounding box 470 from cell 455.

Various embodiments of the invention provide methods and systems for processing geometrical layout design data which enable parallel processing of the geometrical layout design data. The system has a small startup time. Further, processing load in the computation network, is efficiently distributed using the method and system of the invention. Additionally, the minimum-hierarchy representation used by the methods and systems of the invention reduces data transfer in the computation network for processing geometrical layout design data, which avoids congestion in the computation network.

In the foregoing specification, specific embodiments of the invention have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of the invention. The benefits, advantages, solutions to problems, and any element (s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for processing a geometrical layout design data in a computation network, the method comprising:
   generating a minimum-hierarchy representation of the geometrical layout design data by a server, wherein the minimum-hierarchy representation includes a plurality of cells of the geometrical layout design data, and wherein each cell in the minimum-hierarchy representation includes zero or more bounding box information and zero or more cell-references;
   determining a plurality of partitions from the geometrical layout design data by the server, wherein each partition includes one or more parts of one or more fragments, and wherein each fragment includes one or more parts of one or more cells of the plurality of cells;
   assigning at least one partition of the geometrical layout design data to at least one computing device operatively coupled to the server based on first predefined parameters;
   receiving, by the at least one computing device, the minimum-hierarchy representation of the geometrical layout design data and a partition information corresponding to the at least one partition assigned from the server, wherein a partition information corresponding to a partition assigned to a computing device comprises a spatial information corresponding to the partition; and
   retrieving, by the at least one computing device, at least one fragment corresponding to the at least one partition assigned based on each of the partition information and the minimum-hierarchy representation.

2. The method of claim 1, wherein geometrical layout design data corresponding to a partition assigned to a computing device is copied from the server to the computing device.

3. The method of claim 2, wherein geometrical layout design data corresponding to each partition is read by a corresponding computing device in a predefined format.

4. The method of claim 1, wherein the first predefined parameters comprise:
   size of a partition;
   a processing history of a computing device, wherein the processing history comprises a list of partitions processed by the computing device;
   processing load of a computing device;
   processing power of a computing device; and
   network parameters corresponding to the computation network.

5. The method of claim 1, wherein determining the plurality of partitions from the geometrical layout design data comprises:
   dividing the geometrical layout design data into a plurality of fragments based on second predefined parameters; and determining the plurality of partitions from the geometrical layout design data based on the plurality of fragments.

6. The method of claim 5, wherein the plurality of fragments are stored on at least one external storage device.

7. The method of claim 5, wherein the second predefined parameters comprise:
   size of geometrical layout design data within a cell; and
   processing power of a computing device.

8. The method of claim 1 further comprising modifying at least one cell based on third predefined parameters.

9. The method of claim 8, wherein modifying comprises at least one of:
   dividing a cell in the geometrical layout design data into a plurality of sub-cells; and
   merging a plurality of cells to form a composite cell.

10. The method of claim 8, wherein the third predefined parameters comprise:
    size of geometrical layout design data in a cell; and
    geometrical layout design data of a cell being placed in a plurality of design layers.

11. The method of claim 1, wherein a number of partitions corresponding to the geometrical layout design data exceeds a number of computing devices in the computation network.

12. The method of claim 1, wherein a time of assigning a partition to a computing device is determined based on the size of the partition.

13. The method of claim 1, wherein a fragment is retrieved by a computing device based on each of the partition information and the minimum-hierarchy representation.

14. The method of claim 1, wherein at least one of the minimum-hierarchy representation, a geometrical layout design data corresponding to a partition, and a fragment is compressed.

15. The method of claim 1, wherein at least a part of a fragment is retrieved from a server, wherein the server stores the fragment.

16. The method of claim 1, wherein at least a part of a fragment is retrieved from at least one computing device, wherein a computing device stores at least a part of the fragment.

17. A computation network for processing a geometrical layout design data, the computation network comprises:
   a server configured to:
      generate a minimum-hierarchy representation of the geometrical layout design data, wherein the minimum-hierarchy representation includes a plurality of cells of the geometrical layout design data, and wherein each cell in the minimum-hierarchy representation includes zero or more bounding box information and zero or more cell-references;
      determine a plurality of partitions from the geometrical layout design data, wherein each partition includes one or more parts of one or more fragments, and wherein each fragment includes one or more parts of one or more cells of the plurality of cells; and
      assign at least one partition of the geometrical layout design data based on first predefined parameters; and
   at least one computing device operatively coupled to the server, wherein each computing device is configured to:
      receive the minimum-hierarchy representation of the geometrical layout design data and a partition information corresponding to the at least one partition assigned, wherein a partition information corresponding to a partition assigned to a computing device comprises a spatial information corresponding to the partition; and
      retrieve at least one fragment corresponding to the at least one partition assigned based on each of the partition information and the minimum-hierarchy representation.

18. The computation network of claim 17, wherein a computing device is further configured to read geometrical layout design data corresponding to a partition assigned to a computing device from the server.

19. The computation network of claim 17 further comprising at least one external storage device configured to store a plurality of fragments of the geometrical layout design data.

20. The computation network of claim 19, wherein a fragment is accessed from the at least one external storage device by a computing device.

21. The computation network of claim 17, wherein the server is further configured to divide the geometrical layout design data into the plurality of fragments based on second predefined parameters.

22. The computation network of claim 17, wherein the server is configured to maintain a processing database, wherein the processing database comprises at least one of:
   a list of partitions assigned to each computing device;
   processing load of each computing device;
   a list of fragments retrieved by each computing device; and
   network parameters of the computation network.

* * * * *